(12) United States Patent
Yi

(10) Patent No.: US 7,026,877 B2
(45) Date of Patent: Apr. 11, 2006

(54) OPTICAL INPUT PREAMPLIFIER

(76) Inventor: Heqing Yi, No. 16 Building, 439#, Chunxiao Road, Prdong New Area, Shanghai 201203 (CN)

( * ) Notice: Subject to any disclaimer, the term of this patent is extended or adjusted under 35 U.S.C. 154(b) by 40 days.

(21) Appl. No.: 10/714,185

(22) Filed: Nov. 13, 2003

(65) Prior Publication Data

US 2005/0104663 A1    May 19, 2005

(51) Int. Cl.
*H03F 3/08* (2006.01)
(52) U.S. Cl. .................................. 330/308; 250/214 A
(58) Field of Classification Search ................ 330/308; 250/214 A
See application file for complete search history.

(56) References Cited

U.S. PATENT DOCUMENTS

| | | | | |
|---|---|---|---|---|
| 5,430,765 A | * | 7/1995 | Nagahori | 330/259 |
| 5,844,445 A | * | 12/1998 | Takeyari | 330/308 |
| 5,880,610 A | * | 3/1999 | Nishizono et al. | 327/103 |
| 6,069,534 A | * | 5/2000 | Kobayashi | 330/308 |
| 6,084,232 A | * | 7/2000 | Kimura | 330/308 |
| 6,329,881 B1 | * | 12/2001 | Tachigori | 330/308 |
| 6,384,399 B1 | * | 5/2002 | Umeda | 250/214 A |
| 6,639,473 B1 | * | 10/2003 | Kobayashi | 330/308 |
| 6,771,132 B1 | * | 8/2004 | Denoyer et al. | 330/308 |
| 6,778,021 B1 | * | 8/2004 | Denoyer et al. | 330/308 |

* cited by examiner

*Primary Examiner*—Khanh V. Nguyen
(74) *Attorney, Agent, or Firm*—Raymond Y. Chan; David & Raymond

(57) ABSTRACT

An optical input preamplifier includes a photodiode for converting an input optical signal into a photocurrent as an output current, pre-amplifying circuit for pre-amplifying the output current from the photodiode wherein the output current is pre-amplified to form a pre-amplifying current, and an output circuit device converting the pre-amplifying current into an output signal. Therefore, the output current from the photodiode passes through the pre-amplifying circuit and the output circuit unit to substantially enhance the sensitivity of the optical input preamplifier.

16 Claims, 3 Drawing Sheets

OPTICAL INPUT PREAMPLIFIER

BACKGROUND OF THE PRESENT INVENTION

1. Field of Invention

The present invention relates to a light-to-voltage converter, and more particularly to an optical input preamplifier of an optical receiver, which comprises a feedback circuit incorporating with a current-to-voltage converter for substantially reducing the impedance input thereof so as to enhance the sensitivity of the optical input preamplifier.

2. Description of Related Arts

Optical receivers are commonly used as a data transmission apparatus. A conventional optical receiver generally comprises a photodiode which receives an optical signal and outputs a photocurrent, and an optical input preamplifier for converting and amplifying an optical signal into an electrical signal. Accordingly, the optical input preamplifier is one of the major factors to determine the sensitivity of the optical receiver.

Since the photocurrent is directly be converted and amplified into the electrical signal, the optical input preamplifier must provide a low noise, high cut-off frequency and high transcondutance ability so as to provide an accurate output of the optical input preamplifier. Therefore, the cost of the optical input preamplifier is relatively expensive and the structural design of the optical input preamplifier is complicated to be manufactured.

Accordingly, a transimpedance amplifier is commonly used as the optical input preamplifier and a front end of thereof is employed with a metal semiconductor field effect transistor (MESFET) for efficiently converting the optical signal into the electrical signal, wherein the transimpedance amplifier is an amplifier that takes currents as the input and has an output voltage proportional to the input current. However, the common problem of the optical input preamplifier is that the sensitivity of the optical input preamplifier is low in such a manner that the optical input preamplifier may not sufficiently convert and amplify the output signal.

SUMMARY OF THE PRESENT INVENTION

A main object of the present invention is to provide an optical input preamplifier of an optical receiver, which comprises a feedback circuit incorporating with a current-to-voltage converter for substantially reducing the impedance input thereof so as to enhance the sensitivity of the optical input preamplifier.

Another object of the present invention is to provide an optical input preamplifier of an optical receiver, wherein the sensitivity of the optical input preamplifier is at least 10 dB higher than that of a conventional preamplifier, which is at least ten times better than the conventional preamplifier.

Another object of the present invention is to provide an optical input preamplifier of an optical receiver, wherein the structural design of the optical input preamplifier is simplified so as to minimize the manufacturing cost of the optical receiver incorporating with the optical input preamplifier.

Accordingly, in order to accomplish the above objects, the present invention provides an optical input preamplifier, comprising:

a photodiode for converting an input optical signal into a photocurrent as an output current;

means for pre-amplifying the output current from the photodiode, wherein the output current is pre-amplified to form a pre-amplifying current; and an output circuit device converting the pre-amplifying current into an output signal.

These and other objectives, features, and advantages of the present invention will become apparent from the following detailed description, the accompanying drawings, and the appended claims.

DETAILED DESCRIPTION OF THE PREFERRED EMBODIMENTS

Figure 1:
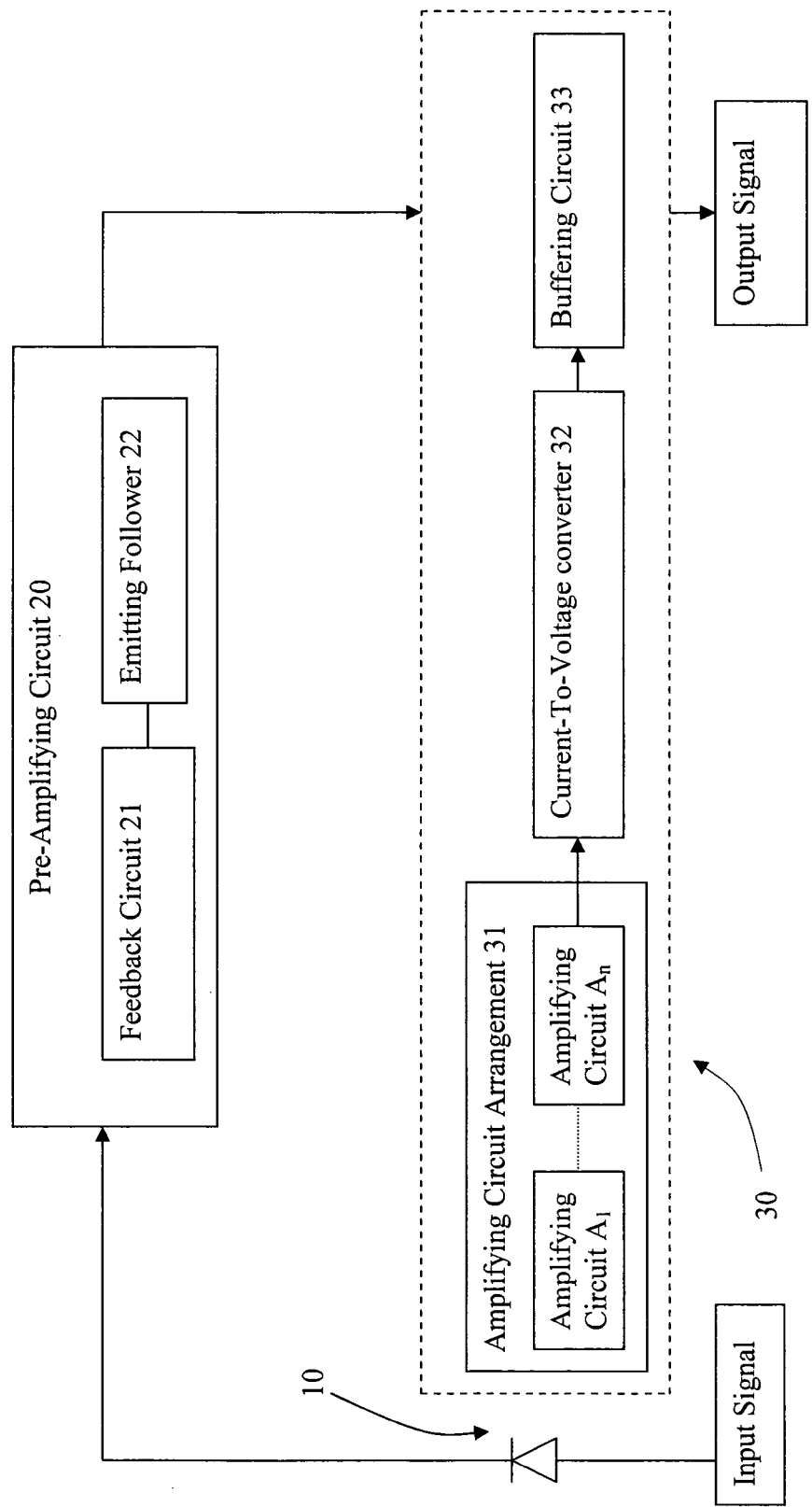
FIG. 1 is a block diagram of an optical receiver incorporating with an optical input preamplifier according to a preferred embodiment of the present invention.

Referring to FIG. 1 of the drawings, an optical input preamplifier of an optical receiver according to a preferred embodiment according to a preferred embodiment of the present invention is illustrated, wherein the optical input preamplifier comprises a photodiode 10 for converting an input optical signal into a photocurrent as an output current, means 20 for pre-amplifying the output current from the photodiode 10, wherein the output current 30 is pre-amplified to form a pre-amplifying current and an output circuit unit 30.

According to the preferred embodiment, the photodiode 10, which is embodied as a kind of P-N junction specifically designed to optimize the inherent photosensitivity, is used for the detection of optical communication signals and for conversion of optical power to electrical power. Accordingly, when the photodiode 10 receives the input optical signal, the photodiode 10 converts the input optical signal into the output current in responsive to the photocurrent.

Figure 2:
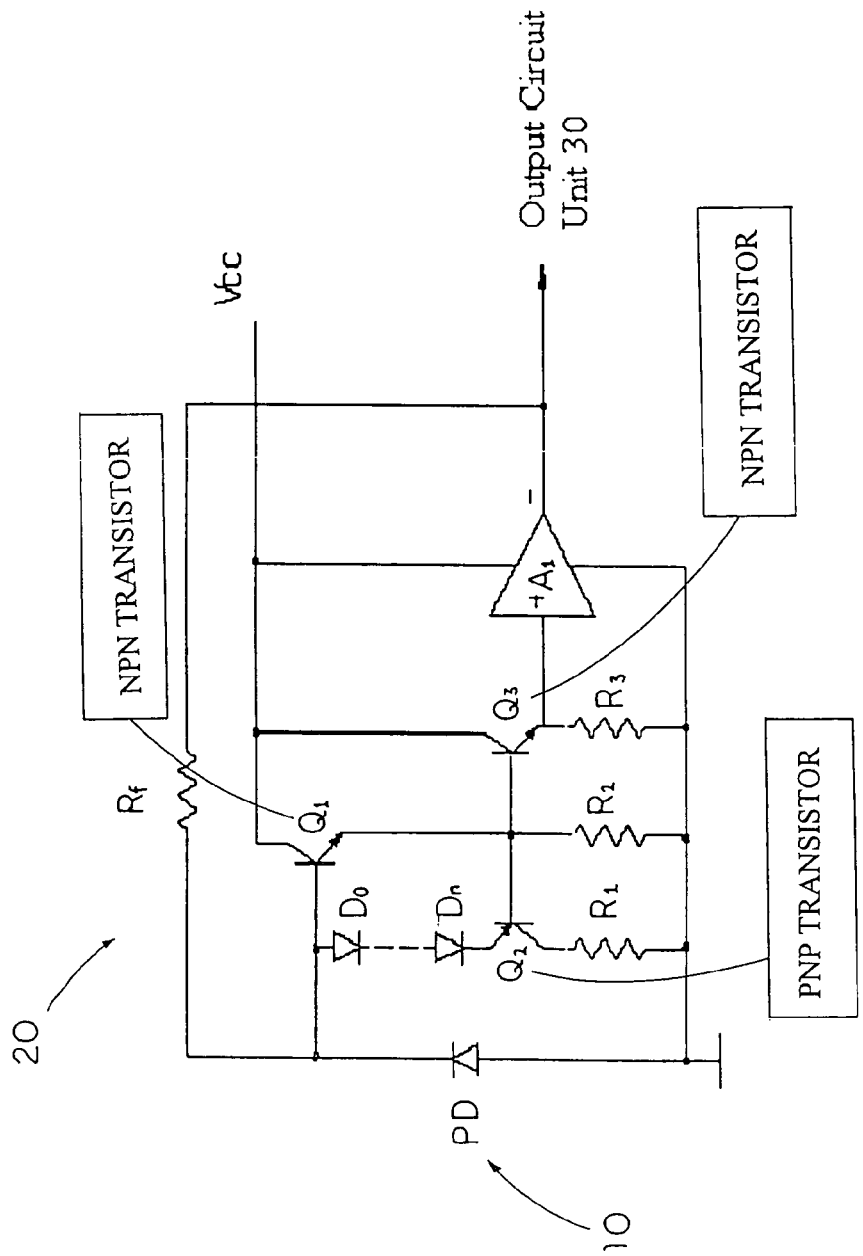
FIG. 2 is a circuit diagram of the optical input preamplifier of the optical receiver according to the above preferred embodiment of the present invention.

As shown in FIG. 2 the electrical configuration of the optical input preamplifier illustrates how the photodiode 10 incorporates the pre-amplifying means 20. The pre-amplifying means 20, which is embodied as an amplifying circuit, comprises a feedback circuit 21 creating a feedback signal in responsive to the output current from the photodiode to substantially form the pre-amplifying current, and an emitting follower 22 electrically connected to the feedback circuit 21 to output the pre-amplifying current therefrom.

According to the preferred embodiment, the feedback circuit 21 comprises a first transistor $Q_1$ electrically connected with the photodiode 10 and a second transistor $Q_2$ electrically coupled with the first transistor $Q_1$ such that when the output current from the photodiode 10 is transmitted to the second transistor $Q_2$ through the first transistor $Q_1$, the second transistor $Q_2$ forms the feedback signal and transmits back to the first transistor $Q_1$ so as to form the pre-amplifying current. Accordingly, the first transistor $Q_1$ is a NPN transistor and the second transistor $Q_2$ is a PNP transistor wherein the second transistor $Q_2$ is electrically coupled with the first transistor $Q_1$ to form a positive feedback circuit of the feedback circuit 21.

The feedback circuit 21 further comprises at least a diode $D_0 \, D_n$ electrically coupling between the first and second transistors $Q_1$, $Q_2$. It is worth to mention that when two or more diodes $D_0 \, D_n$ are electrically coupling between the first and second transistors $Q_1$, $Q_2$, the diodes $D_0$ $D_n$ are electrically connected in a series connection.

According to the preferred embodiment, the flow of the output current passes through the feedback circuit 21 is at least $10^4$ times larger than the flow of the output current only passes through the first transistor $Q_1$ since the feedback circuit 21 substantially amplifies the output current by creating the feedback signal. Therefore, by creating the feedback signal from the feedback circuit 21, the input impedance of the optical input preamplifier can be substantially reduced for minimizing the side effect of the input capacity of the optical input preamplifier, so as to enhance the efficiency of the electrical configuration of the optical input preamplifier.

The emitting follower 22 comprises a third transistor $Q_3$ electrically coupled with the first transistor $Q_1$ to receive the pre-amplifying current therefrom and an inverting amplifier $A_1$ for outputting the pre-amplifying current from the third transistor $Q_3$.

Accordingly, the third transistor $Q_3$ is a NPN transistor electrically coupled with the first transistor $Q_1$ to direct the pre-amplifying current to the inverting amplifier $A_1$. In addition, the inverting amplifier $A_1$ not only outputs the pre-amplifying current as an inverting signal from the feedback circuit 21 but also feedbacks the pre-amplifying current back to the first transistor $Q_1$ through a feedback resistance $R_f$. In other words, the inverting amplifier $A_1$ has two output ends respectively connecting with the output circuit unit 30 for outputting the pre-amplifying current thereto and connecting with the feedback resistance $R_f$ to feedback the pre-amplifying current to the first transistor $Q_1$ through the feedback resistance $R_f$.

Figure 3:
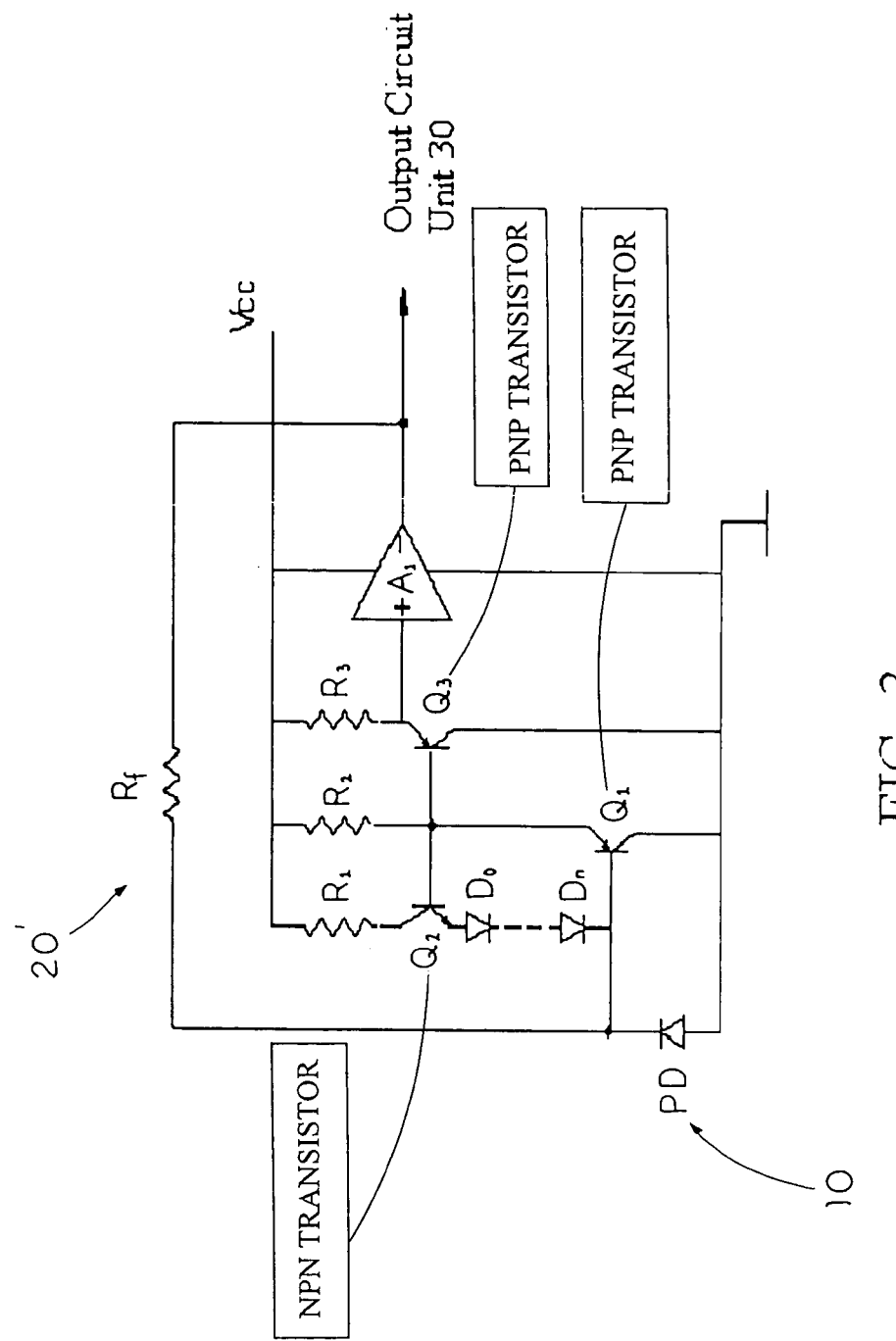
FIG. 3 illustrates an alternative mode of the optical input preamplifier of the optical receiver according to the above preferred embodiment of the present invention.

FIG. 3 illustrates an alternative mode of the pre-amplifying means 20' of the optical input preamplifier which has a similar electrical circuit to form the feedback signal. Accordingly, the first transistor $Q_1$ is a PNP transistor and the second transistor $Q_2$ is a NPN transistor wherein the second transistor $Q_2$ is electrically coupled with the first transistor $Q_1$ to form a positive feedback circuit. In addition, the third transistor $Q_3$ is a PNP transistor electrically coupled with the first transistor $Q_1$ to direct the amplified current to the inverting amplifier $A_1$.

The output circuit unit 30, according to the preferred embodiment, comprises an amplifying circuit arrangement 31 electrically connected with the pre-amplifying means 20 for amplifying the pre-amplifying current, a current-to-voltage converter 32 converting the pre-amplifying current into an output voltage, and a buffering circuit 33 buffering the output voltage as the output signal proportional to the output current of the photodiode 10.

As shown in FIG. 1, the amplifying circuit arrangement 31 comprises a plurality of amplifying circuits $A_1 \cdot A_n$ electrically connected in a series connection to amplify the pre-amplifying current from the pre-amplifying means 20.

It is worth to mention that when the output current from the photodiode 10 passes through the pre-amplifying means 20 and the output circuit unit 30, the sensitivity of the optical input preamplifier is at least 10 dB higher than that of a conventional preamplifier, which is at least ten times better than the conventional preamplifier, while the coverage area of the optical input preamplifier is up to 30 dB.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An optical input preamplifier, comprising:
   a photodiode for converting an input optical signal into a photocurrent as an output current;
   means for pre-amplifying said output current from said photodiode, wherein said output current is pre-amplified to form a pre-amplifying current, wherein said pre-amplifying means comprises a feedback circuit creating a feedback signal in responsive to said output current from said photodiode to substantially form said pre-amplifying current, and an emitting follower electrically connected to said feedback circuit to output said pre-amplifying current therefrom; and
   an output circuit device converting said pre-amplifying current into an output signal, wherein said feedback circuit comprises a first transistor electrically connected with said photodiode and a second transistor electrically coupled with said first transistor such that when said output current from said photodiode is transmitted to said second transistor through said first transistor, said second transistor forms said feedback signal and transmits back to said first transistor so as to form said pre-amplifying current, wherein said first transistor is a NPN transistor and said second transistor is a PNP transistor, wherein said second transistor is electrically coupled with said first transistor to form a positive feedback circuit of said feedback circuit.

2. The optical input preamplifier, as recited in claim 1, wherein said feedback circuit further comprises a plurality of diodes electrically coupling between said first and second transistors, wherein said diodes are electrically connected in a series connection.

3. The optical input preamplifier, as recited in claim 1, wherein said emitting follower comprises a third transistor electrically coupled with said first transistor to receive said pre-amplifying current therefrom and an inverting amplifier for outputting said pre-amplifying current from said third transistor.

4. The optical input preamplifier, as recited in claim 3, wherein said third transistor is a NPN transistor electrically coupled with said first transistor to direct said pre-amplifying current to said inverting amplifier.

5. The optical input preamplifier, as recited in claim 4, wherein said inverting amplifier has two output ends respectively connecting with said output circuit device for outputting said pre-amplifying current thereto and connecting with a feedback resistance to feedback said pre-amplifying current to said first transistor through said feedback resistance.

6. The optical input preamplifier, as recited in claim 5, wherein said output circuit device comprises an amplifying circuit arrangement electrically connected with said pre-amplifying means to amplify said pre-amplifying current, a current-to-voltage converter converting said pre-amplifying current into an output voltage, and a buffering circuit buffering said output voltage as said output signal proportional to said output current of said photodiode.

7. The optical input preamplifier, as recited in claim 6, wherein said amplifying circuit arrangement comprises a plurality of amplifying circuits electrically connected in a series connection to amplify said pre-amplifying current from said pre-amplifying means.

8. An optical input preamplifier, comprising:
a photodiode for converting an input optical signal into a photocurrent as an output current;
means for pre-amplifying said output current from said photodiode, wherein said output current is pre-amplified to form a pre-amplifying current, wherein said pre-amplifying means comprises a feedback circuit creating a feedback signal in responsive to said output current from said photodiode to substantially form said pre-amplifying current, and an emitting follower electrically connected to said feedback circuit to output said pre-amplifying current therefrom; and
an output circuit device converting said pre-amplifying current into an output signal, wherein said feedback circuit comprises a first transistor electrically connected with said photodiode and a second transistor electrically coupled with said first transistor such that when said output current from said photodiode is transmitted to said second transistor through said first transistor, said second transistor forms said feedback signal and transmits back to said first transistor so as to form said pre-amplifying current, wherein said first transistor is a PNP transistor and said second transistor is a NPN transistor, wherein said second transistor is electrically coupled with said first transistor to form a positive feedback circuit of said feedback circuit.

9. The optical input preamplifier, as recited in claim 8, wherein said feedback circuit further comprises a plurality of diodes electrically coupling between said first and second transistors, wherein said diodes are electrically connected in a series connection.

10. The optical input preamplifier, as recited in claim 8, wherein said emitting follower comprises a third transistor electrically coupled with said first transistor to receive said pre-amplifying current therefrom and an inverting amplifier for outputting said pre-amplifying current from said third transistor.

11. The optical input preamplifier, as recited in claim 10, wherein said third transistor is a PNP transistor electrically coupled with said first transistor to direct said pre-amplifying current to said inverting amplifier.

12. The optical input preamplifier, as recited in claim 11, wherein said inverting amplifier has two output ends respectively connecting with said output circuit device for outputting said pre-amplifying current thereto and connecting with a feedback resistance to feedback said pre-amplifying current to said first transistor through said feedback resistance.

13. The optical input preamplifier, as recited in claim 12, wherein said output circuit device comprises an amplifying circuit arrangement electrically connected with said pre-amplifying means to amplify said pre-amplifying current, a current-to-voltage converter converting said pre-amplifying current into an output voltage, and a buffering circuit buffering said output voltage as said output signal proportional to said output current of said photodiode.

14. The optical input preamplifier, as recited in claim 13, wherein said amplifying circuit arrangement comprises a plurality of amplifying circuits electrically connected in a series connection to amplify said pre-amplifying current from said pre-amplifying means.

15. An optical input preamplifier, comprising:
a photodiode for converting an input optical signal into a photocurrent as an output current;
means for pre-amplifying said output current from said photodiode, wherein said output current is pre-amplified to form a pre-amplifying current, wherein said pre-amplifying means comprises a feedback circuit creating a feedback signal in responsive to said output current from said photodiode to substantially form said pre-amplifying current, and an emitting follower electrically connected to said feedback circuit to output said pre-amplifying current therefrom; and
an output circuit device converting said pre-amplifying current into an output signal, wherein said feedback circuit comprises a first transistor electrically connected with said photodiode and a second transistor electrically coupled with said first transistor such that when said output current from said photodiode is transmitted to said second transistor through said first transistor, said second transistor forms said feedback signal and transmits back to said first transistor so as to form said pre-amplifying current, wherein said emitting follower comprises a third transistor electrically coupled with said first transistor to receive said pre-amplifying current therefrom and an inverting amplifier for outputting said pre-amplifying current from said third transistor.

16. The optical input preamplifier, as recited in claim 15, wherein said inverting amplifier has two output ends respectively connecting with said output circuit device for outputting said pre-amplifying current thereto and connecting with a feedback resistance to feedback said pre-amplifying current to said first transistor through said feedback resistance.

* * * * *